(12) United States Patent
Khawas et al.

(10) Patent No.: US 11,946,973 B1
(45) Date of Patent: Apr. 2, 2024

(54) HOLD TIME IMPROVED LOW AREA FLIP-FLOP ARCHITECTURE

(71) Applicant: TEXAS INSTRUMENTS INCORPORATED, Dallas, TX (US)

(72) Inventors: Arnab Khawas, Bangalore (IN); Badarish Subbannavar, Bangalore (IN); Madhavan Sainath Rao Pissay, Hyderbad (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/071,208

(22) Filed: Nov. 29, 2022

(51) Int. Cl.
*G01R 31/28* (2006.01)
*G01R 31/3185* (2006.01)
*G01R 31/319* (2006.01)

(52) U.S. Cl.
CPC ........... *G01R 31/318572* (2013.01); *G01R 31/318552* (2013.01); *G01R 31/31926* (2013.01)

(58) Field of Classification Search
CPC ...... G01R 31/318572; G01R 31/31926; G01R 31/318552
See application file for complete search history.

(56) References Cited

U.S. PATENT DOCUMENTS

| 9,081,061 B1* | 7/2015 | Agarwal | G01R 31/318541 |
| 2008/0284480 A1* | 11/2008 | Ahmadi | G01R 31/31858 |
| | | | 327/210 |
| 2014/0040688 A1* | 2/2014 | Zhang | G01R 31/318541 |
| | | | 714/E11.155 |
| 2017/0276729 A1* | 9/2017 | Kim | G01R 31/318541 |

* cited by examiner

*Primary Examiner* — Samir W Rizk
(74) *Attorney, Agent, or Firm* — Brian D. Graham; Frank D. Cimino

(57) ABSTRACT

In an example, a scan flip-flop includes a first transistor and a second transistor coupled to a data input. The scan flip-flop includes a third transistor coupled to a clock input and a fourth transistor coupled to an inverse clock input. The scan flip-flop includes a fifth transistor coupled to a scan enable input and the first transistor, and includes a sixth transistor coupled to an inverse scan enable input and the second transistor. The scan flip-flop includes an input multiplexer that includes a seventh transistor and eighth transistor coupled to the scan data input, a ninth transistor coupled to the scan enable input, and a tenth transistor coupled to the inverse scan enable input. The input multiplexer includes a first diode-connected transistor coupled between a first voltage rail and the seventh transistor, and includes a second diode-connected transistor coupled between a second voltage rail and the eighth transistor.

20 Claims, 3 Drawing Sheets

HOLD TIME IMPROVED LOW AREA FLIP-FLOP ARCHITECTURE

BACKGROUND

A scan flip-flop is a storage device that has separate scan and data inputs and scan and data outputs. A scan flip-flop can be implemented using D flip-flop with a 2x1 multiplexer added at a data (D) input. A scan enable input of the scan flip-flop receives a control signal (e.g., an enable signal) that indicates to the multiplexer to select between the D input (data or functional mode) or the scan (SD) input (scan mode). The selected input is passed through the multiplexer. A flip-flop also has a setup time and a hold time. The setup time is the amount of time required for the input to the flip-flop to be stable before a clock edge, so the input is properly captured on the clock edge. The hold time is the minimum amount of time required for the input to the flip-flop to be stable after a clock edge, so the input is properly captured on the clock edge.

SUMMARY

In accordance with at least one example of the description, a system includes a scan flip-flop that includes a data input, a clock input, a scan data input, a scan enable input, and an output. The scan flip-flop also includes a first transistor and a second transistor coupled to the data input. The scan flip-flop includes a third transistor coupled to the clock input and a fourth transistor coupled to an inverse clock input. The scan flip-flop also includes a fifth transistor coupled to the scan enable input and the first transistor. The scan flip-flop includes a sixth transistor coupled to an inverse scan enable input and the second transistor. The scan flip-flop also includes an input multiplexer that includes the first transistor, second transistor, fifth transistor, and sixth transistor, and also includes a seventh transistor coupled to the scan data input, an eighth transistor coupled to the scan data input, a ninth transistor coupled to the scan enable input, and a tenth transistor coupled to the inverse scan enable input. The input multiplexer also includes a first diode-connected transistor coupled between a first voltage rail and the seventh transistor. The input multiplexer also includes a second diode-connected transistor coupled between a second voltage rail and the eighth transistor.

In accordance with at least one example of the description, a system includes a scan flip-flop that includes a functional data input, a clock input, a scan data input, a scan enable input, and an output. The scan flip-flop also includes a first transistor and a second transistor coupled to the functional data input, where the functional data input is configured to receive a data signal. The scan flip-flop includes a third transistor coupled to the clock input and a fourth transistor coupled to an inverse clock input, where the clock input is configured to receive a clock signal, and the inverse clock input is configured to receive an inverse of the clock signal. The scan flip-flop includes a fifth transistor coupled to the scan enable input and the first transistor. The scan flip-flop also includes a sixth transistor coupled to an inverse scan enable input and the second transistor. The scan flip-flop includes an input multiplexer that includes the first transistor, second transistor, fifth transistor, and sixth transistor, and also includes a seventh transistor coupled to the scan data input, an eighth transistor coupled to the scan data input, a ninth transistor coupled to the scan enable input, and a tenth transistor coupled to the inverse scan enable input, where the input multiplexer is configured to select between the functional data input and the scan data input. The input multiplexer also includes a first diode-connected transistor coupled between a first voltage rail and the seventh transistor, where the first diode-connected transistor is configured to provide a first voltage to a source terminal of the seventh transistor, where the first voltage is less than a first supply voltage.

The input multiplexer includes a second diode-connected transistor coupled between a second voltage rail and the eighth transistor, where the second diode-connected transistor is configured to provide a second voltage to a source terminal of the eighth transistor, where the second voltage is greater than a second supply voltage.

BRIEF DESCRIPTION OF THE DRAWINGS

The same reference numbers or other reference designators are used in the drawings to designate the same or similar (functionally and/or structurally) features.

DETAILED DESCRIPTION

The hold time of a flip-flop is an important parameter for circuit design. The hold time is the minimum amount of time required for the input to the flip-flop to be stable after a clock edge, so the input is properly captured on the clock edge. A higher hold time may impose design constraints on a circuit. For example, if a flip-flop has a high hold time requirement, hold buffers may be added to meet the hold constraint. Particularly, multiple scan flip-flops are often connected back to back in a scan chain to test for manufacturing faults in a chip. If several flop-to-flop transfer paths in a scan chain have multiple hold buffers to meet the hold constraint, the design area, circuit area, routing complexity, and power usage of the chip may increase significantly.

A scan flip-flop architecture is described herein that reduces the hold time requirement of the scan flip-flop in scan mode (e.g., when the scan enable input is enabled). The scan flip-flop architecture includes an input multiplexer that selects between the D input (functional data mode) or the SD input (scan data mode). In an example, the input multiplexer includes two diode-connected transistors. Each diode-connected transistor is placed between a voltage rail and the other components in the input multiplexer (e.g., one coupled to a positive voltage rail and one coupled to a negative voltage rail). The diode-connected transistors have a gate terminal and a drain terminal shorted together, so they each operate in saturation. The diode-connected transistors reduce the effective voltage across the other transistors that make up the input multiplexer, compared to the previous architecture. Reducing the effective voltages across the transistors of the input multiplexer reduces the speed of those transistors. A lower voltage across a transistor increases the time for the transistor to charge or discharge any capacitive loads coupled to the transistor, which reduces the transistor's switching speed. Reducing the switching speed of the transistors in the input multiplexer reduces the hold time requirement of the scan flip-flop in scan mode. With a reduced hold time, the number of hold buffers in a scan chain of scan flip-flops may be reduced while still achieving the desired performance of the circuit. By reducing the number of hold buffers, the circuit area, routing complexity, and power usage of the chip may be reduced.

Figure 1:
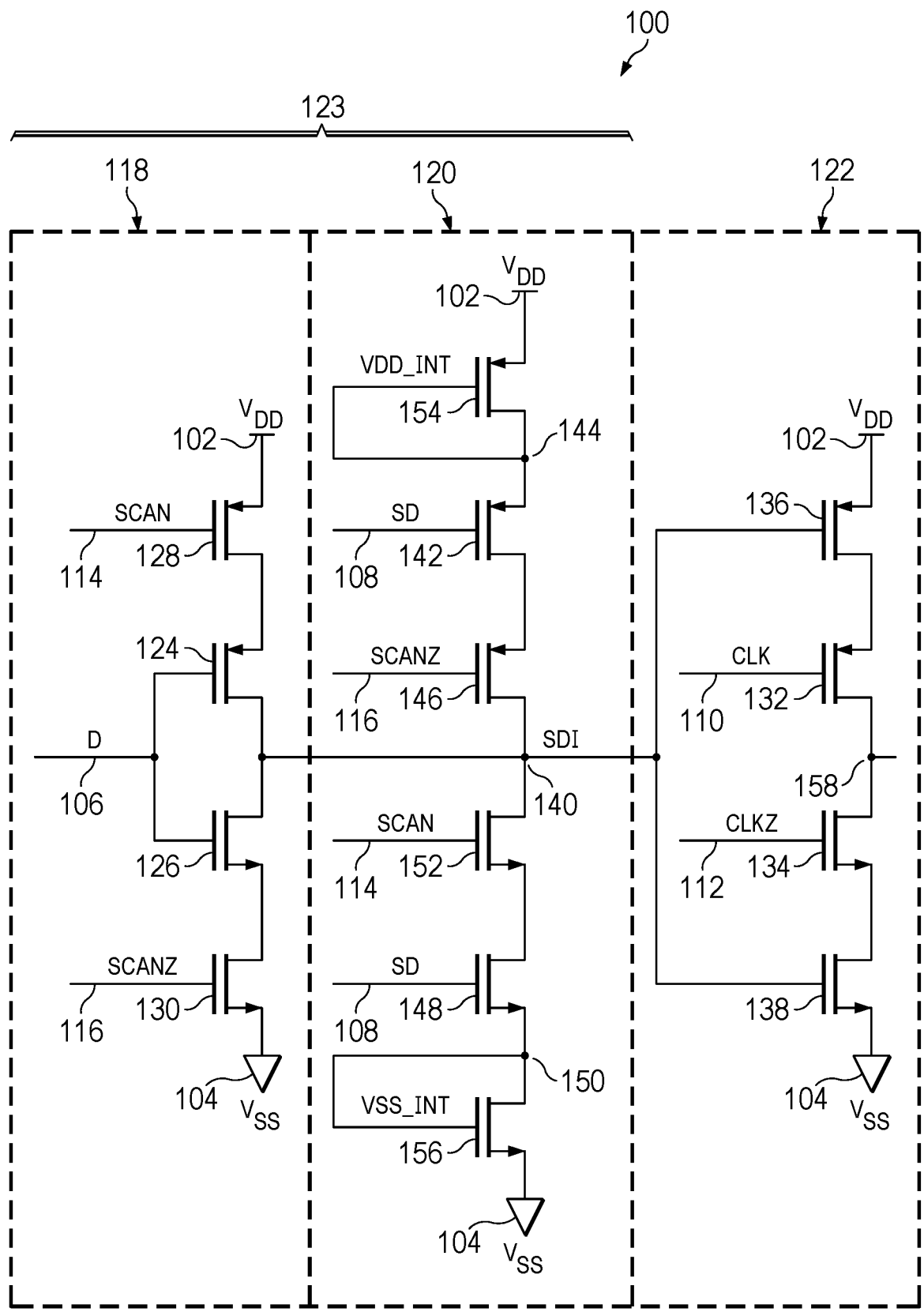
FIG. 1 is a circuit diagram of a portion of a scan flip-flop with improved hold time in accordance with various examples.

FIG. 1 is a circuit diagram of an input multiplexer 100 (e.g., input mux 100) with a tri-stated clock inverter with improved hold time in accordance with various examples herein. Input mux 100 is a portion of a scan flip-flop in accordance with various examples herein. Input mux 100 includes a first voltage rail 102 that provides a voltage $V_{DD}$ to input mux 100. Input mux 100 also includes a second voltage rail 104 that provides voltage $V_{SS}$ to input mux 100. $V_{DD}$ and $V_{SS}$ may have any suitable values. Second voltage rail 104 may be coupled to a ground terminal in one example.

Input mux 100 includes a data (D) input 106, a scan data (SD) input 108, and a clock (CLK) input 110. In this example architecture, an inverse clock input CLKZ 112 is also provided. Input mux 100 also includes a scan enable (SCAN) input 114, and an inverse scan enable (SCANZ) input 116. If SCAN input 114 receives an input signal of 1, the SD input 108 is enabled (e.g., scan mode). If SCAN input 114 receives an input signal of 0, the D input 106 is enabled (e.g., data mode or functional mode).

Input mux 100 includes three "columns" of transistors that are shown as columns 118, 120, and 122. The first column 118 includes the D input and has four transistors in this example. The second column 120 is the SD stack (e.g., the stack of transistors that includes the SD input), and includes six transistors in this example. Columns 118 and 120 may make up scan multiplexer 123 (e.g., scan mux 123) in some examples. Input mux 100 may also be referred to as the scan multiplexer in some examples. The third column 122 is the tri-stated clock inverter (e.g., clock tri-state), and includes the CLK input 110 and CLKZ input 112. The details of these three columns of transistors are provided below.

Column 118 includes the D input 106, SCAN input 114, and SCANZ input 116. These three inputs are coupled to four transistors as shown. Transistor 124 may be referred to herein as a first transistor, and transistor 126 may be referred to herein as a second transistor. D input 106 is coupled to the gates of transistor 124 and transistor 126. In this example, transistor 124 is a p-type transistor (e.g., p-type device), such as a p-channel metal oxide semiconductor (PMOS) transistor. Transistor 126 is an n-type transistor (e.g., n-type device), such as an n-channel metal oxide semiconductor (NMOS) transistor. The transistors described herein may be field effect transistors (FETS) in some examples, or may be other types of transistors in other examples. Transistor 124 includes a drain coupled to a drain of transistor 126. In examples herein, gate terminals may be referred to as gates, source terminals may be referred to as sources, and drain terminals may be referred to as drains.

Column 118 includes the SCAN input 114 coupled to a gate of transistor 128. Transistor 128 includes a source coupled to first voltage rail 102 and a drain coupled to the source of transistor 124. Transistor 128 may be referred to as a fifth transistor in examples herein (transistors referred to herein as third and fourth transistors are described below). In this example, transistor 128 may be a p-type transistor.

Column 118 includes the SCANZ input 116 coupled to a gate of transistor 130. Transistor 130 includes a source coupled to second voltage rail 104 and a drain coupled to the source of transistor 126. Transistor 130 may be referred to as a sixth transistor in examples herein. In this example, transistor 130 may be an n-type transistor.

Column 122 includes the CLK input 110 coupled to a transistor 132. CLK input 110 is coupled to the gate of transistor 132. Transistor 132 includes a drain coupled to transistor 134 and a source coupled to transistor 136. Transistor 132 may be referred to as a third transistor in examples herein. In this example, transistor 132 may be a p-type transistor. The drain of transistor 132 and the drain of transistor 134 are coupled at a node 158. Additional circuitry described below with respect to FIG. 3 may be coupled to node 158.

Column 122 includes the CLKZ input 112 coupled to transistor 134. CLKZ input 112 is coupled to the gate of transistor 134. Transistor 134 includes a drain coupled to the drain of transistor 132 and a source coupled to a drain of transistor 138. Transistor 134 may be referred to as a fourth transistor in examples herein. In this example, transistor 134 may be an n-type transistor.

Column 122 also includes transistor 136. Transistor 136 includes a gate coupled to SDI (scan data input) node 140. Transistor 136 includes a source coupled to first voltage rail 102 and a drain coupled to the source of transistor 132. Transistor 136 may be a p-type transistor in an example.

Column 122 also includes transistor 138. Transistor 138 includes a gate coupled to SDI node 140. Transistor 138 includes a source coupled to second voltage rail 104 and a drain coupled to the source of transistor 134. Transistor 138 may be an n-type transistor in an example.

Column 120 is the SD stack. SDI node 140 is coupled to the drain of transistor 124 and the drain of transistor 126. Column 120 includes a transistor 142 with a gate coupled to SD input 108. Transistor 142 includes a source coupled to VDD_INT node 144 and a drain coupled to transistor 146. Transistor 142 may be referred to as a seventh transistor in examples herein. Transistor 142 may be a p-type transistor in this example.

Column 120 includes a transistor 148 with a gate coupled to SD input 108. Transistor 148 includes a source coupled to VSS-INT node 150 and a drain coupled to transistor 152. Transistor 148 may be referred to as an eighth transistor in examples herein. Transistor 148 may be an n-type transistor in this example.

Column 120 includes a transistor 146 with a gate coupled to SCANZ input 116. Transistor 146 includes a source coupled to transistor 142 and a drain coupled to SDI node 140. Transistor 146 may be referred to as a tenth transistor in examples herein. Transistor 146 may be a p-type transistor in this example.

Column 120 also includes a transistor 152 with a gate coupled to SCAN input 114. Transistor 152 includes a source coupled to transistor 148 and a drain coupled to SDI node 140. Transistor 152 may be referred to as a ninth transistor in examples herein. Transistor 152 may be an n-type transistor in this example.

Column 120 also includes two diode-connected transistors 154 and 156. Transistor 154 includes a gate coupled to a drain. The gate-drain connection is also referred to as VDD_INT node 144. The source of transistor 154 is coupled to first voltage rail 102 (e.g., a voltage source). Transistor 154 may be referred to as a first diode-connected transistor in an example. Transistor 154 may be a p-type transistor in this example.

Transistor 156 includes a gate coupled to a drain. The gate-drain connection is also referred to as VSS-INT node 150. The source of transistor 156 is coupled to second voltage rail 104. Transistor 156 may be referred to as a second diode-connected transistor in an example. Transistor 156 may be an n-type transistor in this example.

Scan multiplexer 123 (e.g., columns 118 and 120) selects between a data signal at the D input 106 and a data signal at the SD input 108. The selected input is passed through the scan multiplexer 123 to SDI node 140, depending on the value of SCAN input 114. In operation, the diode-connected transistors 154 and 156 reduce the speed of the other transistors (142, 146, 148, and 152) in column 120. Diode-connected transistors 154 and 156 each have a gate terminal coupled to a drain terminal, and therefore operate similarly to a diode. If diode-connected transistors 154 and 156 were absent from column 120, the effective voltage difference across column 120 would be $V_{DD}$-$V_{SS}$, or the difference between the first voltage rail 102 and the second voltage rail 104. The voltage difference $V_{DD}$-$V_{SS}$ would cause the transistors in column 120 to operate at a first speed, which would produce a first hold time for the scan flip-flop. The transistors would operate at a fast speed with a voltage difference of $V_{DD}$-$V_{SS}$, which increases the hold time requirement for the scan flip-flop in scan mode.

With the addition of diode-connected transistors 154 and 156, the voltage difference across column 120 (transistors 142, 146, 148, and 152, but not including transistors 154 and 156) is no longer $V_{DD}$-$V_{SS}$; rather, the voltage difference across transistors 142, 146, 148, and 152 is VDD_INT–VSS-INT. The gate and drain of the diode-connected transistor 154 are shorted together, and the gate and drain of the diode-connected transistor 156 are shorted together. Therefore, for both diode-connected transistors 154 and 156, the gate-to-source voltage is the same as the drain-to-source voltage ($V_{GS}=V_{DS}$). The two diode-connected transistors 154 and 156 always operate in saturation. Because there is a voltage drop across each transistor, the voltage VDD_INT at VDD_INT node 144 is less than $V_{DD}$ (by the amount $V_{DS}$). Likewise, the voltage VSS-INT at VSS-INT node 150 is higher than $V_{SS}$ (by the amount $V_{DS}$).

The effective voltage across column 120 would be $V_{DD}$-$V_{SS}$ without diode-connected transistors 154 and 156, but that voltage difference is reduced by the two voltage drops caused by diode-connected transistors 154 and 156 in the architecture shown in input mux 100. With the diode-connected transistors 154 and 156, the voltage difference across column 120 (e.g., the SD stack) is VDD_INT–VSS-INT. Because of this reduced supply voltage across column 120, the speed of the transistors 142, 146, 148, and 152 is reduced while charging or discharging, which reduces the hold time requirement of input mux 100 in scan mode. In input mux 100, the transistors in column 120 operate at a second speed in scan mode that is slower than the first speed described above. Input mux 100 has a second hold time that is less than the first hold time without the diode-connected transistors 154 and 156.

The addition of diode-connected transistors 154 and 156 reduces the hold time requirement of input mux 100 in scan mode with a minimal increase in the layout area. The addition of diode-connected transistors 154 and 156 also does not impact other timing parameters, such as setup time or hold time of the D input in the functional mode when SCAN input 114 is 0. Reducing the speed of the transistors in column 120 increases the delay in column 120 (e.g., a delay of the scan data input path), which means the scan signal at the input of input mux 100 (SD) does not have to be held as long for the signal to be captured when the clock changes in scan mode.

In other examples, only one diode-connected transistor may be used in column 120. For example, diode-connected transistor 154 may be absent, which creates a voltage drop of $V_{DD}$–VSS-INT across column 120. In another example, diode-connected transistor 156 may be absent, which creates a voltage drop of VDD_INT-$V_{SS}$ across column 120. In some examples, one voltage drop, caused by having either diode-connected transistor 154 or diode-connected transistor 156, may produce a desirable result with respect to reducing the hold time requirement of the flip-flop.

In other examples, a different circuit component may be useful for providing a voltage drop rather than a diode-connected transistor. For example, diodes, transistors, or other components may be useful for providing a VDD_INT voltage and a VSS-INT voltage in the column 120.

Figure 2:
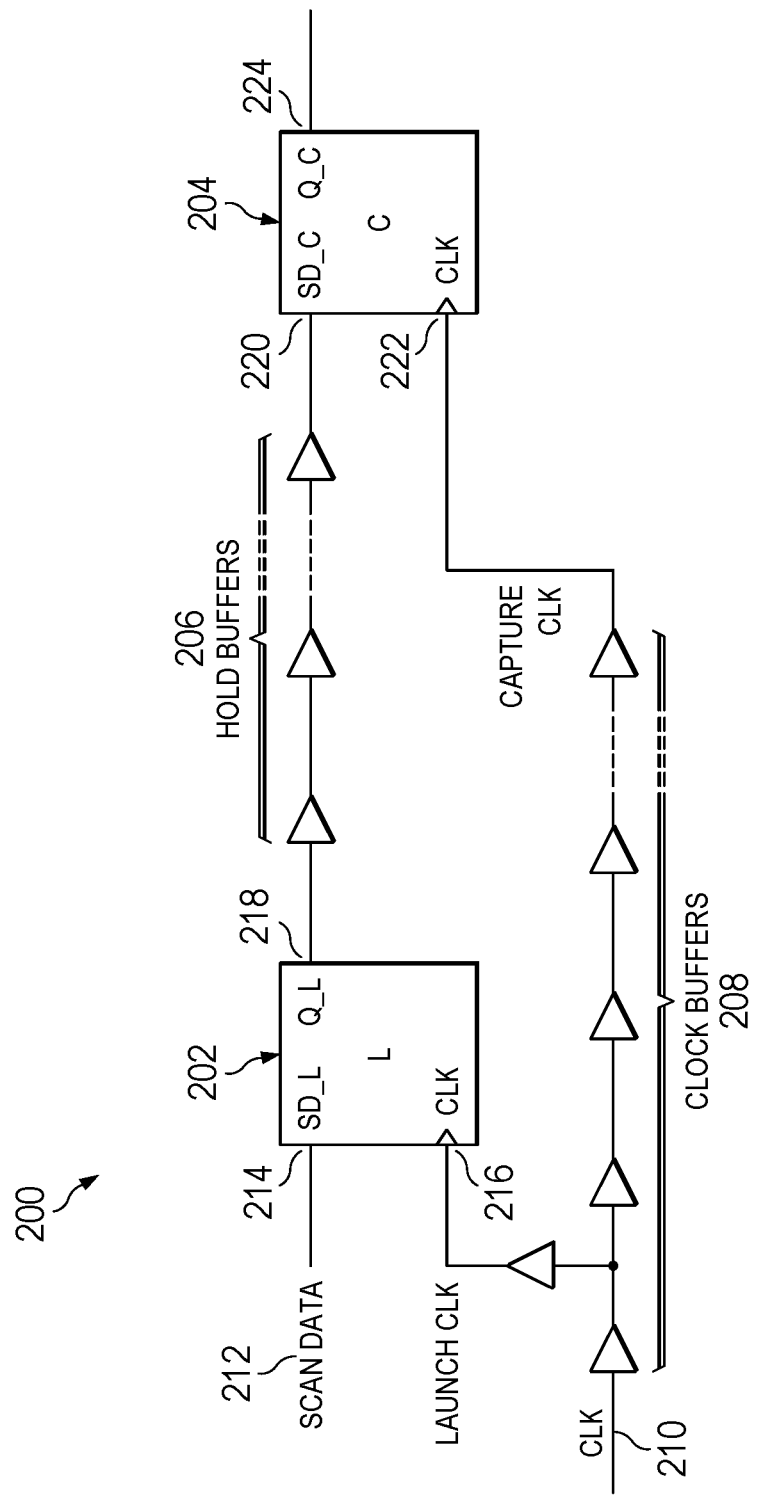
FIG. 2 is a block diagram of a portion of a scan chain in accordance with various examples.

FIG. 2 is a block diagram of a portion of a scan chain 200 in accordance with various examples herein. Scan chain 200 includes scan flip-flops 202 and 204. Scan chain 200 also includes hold buffers 206 and clock buffers 208. Scan flip-flop 202 is referred to as a launch flop, and scan flip-flop 204 is referred to as a capture flop. Scan chain 200 also includes a CLK (clock) signal 210 and scan data 212.

Scan chains may be useful for testing circuits for manufacturing faults. In a scan chain, a series of scan flip-flops are connected with the output Q of a first flop coupled to the SD input of the next flop. A clock signal is provided to each flop in the scan chain. The flops are connected in a chain that effectively acts as a shift register.

The scan flip-flop 202 has a scan data input 214, a CLK input 216, and a Q output 218. Scan flip-flop 204 has a scan data input 220, a CLK input 222, and a Q output 224. In operation, scan data 212 is provided to scan flip-flop 202 via scan data input 214. When a first positive edge of CLK signal 210 (Launch CLK) reaches CLK input 216 after passing through at least some clock buffers 208, the data in scan flip-flop 202 is provided from Q output 218 to scan flip-flop 204. The data passes through hold buffers 206 before reaching scan data input 220 of scan flip-flop 204. The number of hold buffers 206 determines the delay of the data before reaching scan flip-flop 204. The hold buffers 206 delay the data to prevent a hold violation. A hold violation occurs if the scan flip-flop 204 captures the data at the wrong clock signal. As an example, in this scan chain 200, scan flip-flop 204 should capture the data from scan flip-flop 202 on the next positive edge of CLK 210 after the positive edge that launches the data from scan flip-flop 202. A first positive edge of CLK 210 is received by scan flip-flop 202 to launch the data, and a second positive edge of CLK 210 is received by scan flip-flop 204 (Capture CLK) to capture the data. The hold buffers 206 and the clock buffers 208 are provided to produce the appropriate timing of clock and data reaching each flip-flop in the scan chain 200. In other examples, the systems described herein may be extended to a negative edge triggered flip flop to reduce the SD hold requirement.

In an example scan chain 200 where the flip-flops use the architecture of input mux 100 described herein, the hold time of each of the flip-flops is reduced. By reducing the hold time of each flip-flop in the scan chain 200, the number of hold buffers 206 may be reduced in the scan chain 200. A string of hold buffers 206 involves substantial routing, area usage, and timing considerations to implement accurately. The use of input mux 100 in the flip-flops 202 and 204 in scan chain 200 may reduce the number of hold buffers 206, which improves area usage and simplifies routing and timing for the circuit.

In examples described herein, hold time requirements for the SD input of a scan flip-flop may be reduced. The hold time requirements may be reduced for flip-flops with various temperatures and supply voltage values. The hold time requirements for flip-flops in a scan chain may also be reduced. A scan chain that uses input muxes 100 as described herein may also produce a large reduction in the number of hold buffers, which reduces area, timing complexity, and routing complexity of the circuit.

Figure 3:
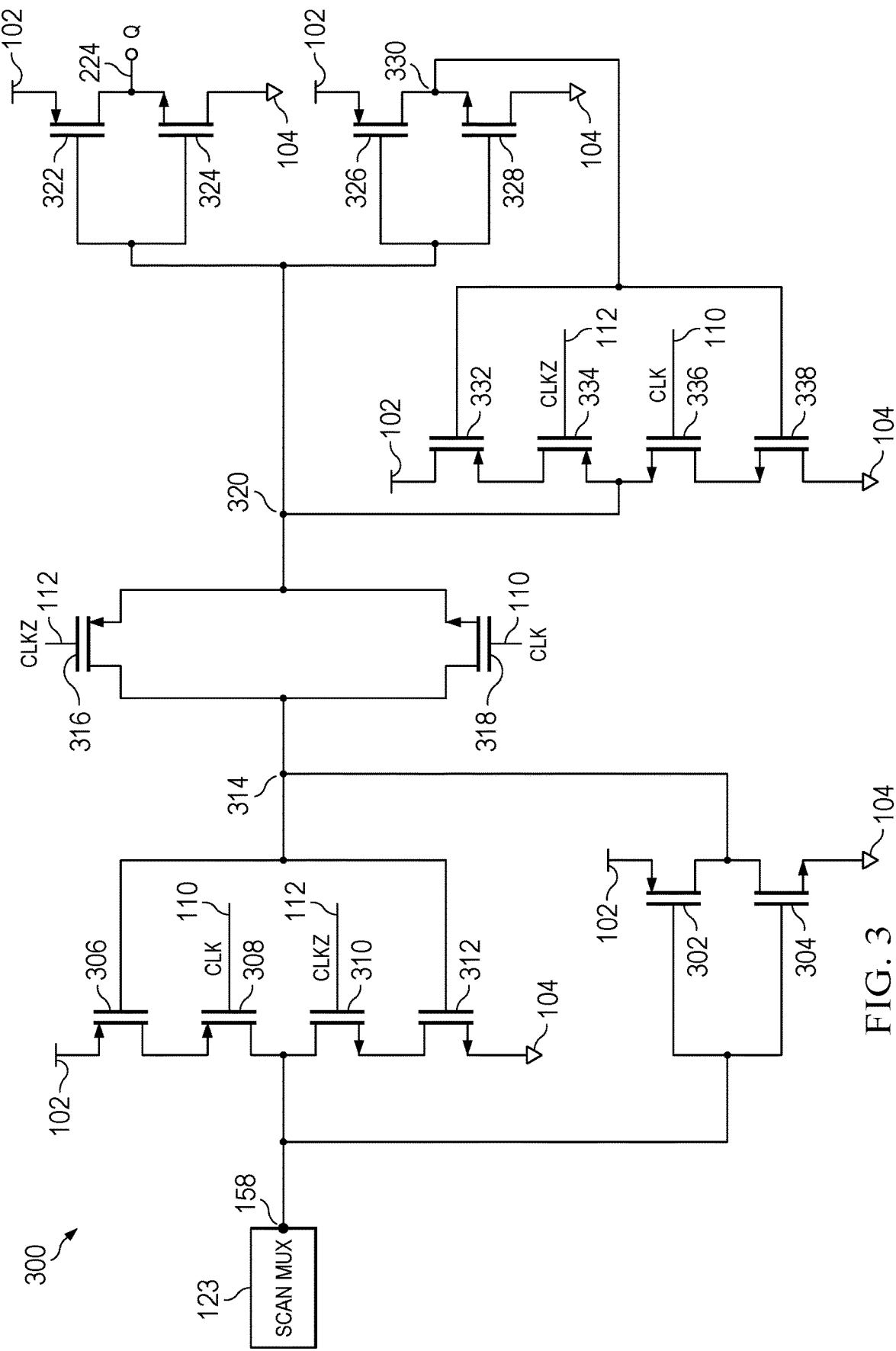
FIG. 3 is a circuit diagram of a system including a scan flip-flip with improved hold time in accordance with various examples.

FIG. 3 is a scan flip-flop 300 that includes an input mux with improved hold time in accordance with various examples. FIG. 3 includes input mux 100 as described above with respect to FIG. 1, and includes additional circuitry coupled to input mux 100 that may be found in a scan flip-flop in one example. Like reference numerals refer to like components. In scan flip-flop 300, some transistors are shown as p-type transistors and some transistors are shown as n-type transistors, but different types of transistors may be useful in other examples. Scan flip-flop 300 includes clock circuitry and Q output 224, along with additional circuitry.

Scan flip-flop 300 includes transistors 302 and 304. A gate of transistor 302 is coupled to a gate of transistor 304, and those gates are coupled to node 158 of scan multiplexer 123. Transistor 302 may be a p-type transistor with a source coupled to first voltage rail 102. Transistor 304 may be an n-type transistor with a source coupled to second voltage rail 104.

Scan flip-flop 300 includes transistors 306, 308, 310, and 312 as shown. Transistors 306 and 308 may be p-type transistors, and transistors 310 and 312 may be n-type transistors. Transistor 306 has a source coupled to first voltage rail 102 and a drain coupled to a source of transistor 308. A gate of transistor 306 is coupled to node 314. Transistor 308 has a drain coupled to a drain of transistor 310 and a gate coupled to CLKZ input 112. Transistor 310 has a source coupled to a drain of transistor 312 and a gate coupled to CLK input 110. Transistor 312 has a source coupled to second voltage rail 104 and a gate coupled to node 314. Transistors 306, 308, 310, and 312 may make up third column 122 (e.g., the clock tri-state) in one example as described above. Scan multiplexer 123 and transistors 306, 308, 310, and 312 may make up input mux 100 in one example.

Scan flip-flop 300 also includes transistors 316 and 318. Transistor 316 may be a p-type transistor, and transistor 318 may be an n-type transistor. Transistor 316 includes a drain coupled to node 314, a source coupled to node 320, and a gate coupled to CLKZ input 112. Transistor 318 includes a drain coupled to node 314, a source coupled to node 320, and a drain coupled to CLK input 110.

Scan flip-flop 300 includes transistors 322 and 324. Transistor 322 may be a p-type transistor, and transistor 324 may be an n-type transistor. Transistor 322 includes a source coupled to first voltage rail 102, a gate coupled to node 320, and a drain coupled to Q output 224. Transistor 324 includes a drain coupled to second voltage rail 104, a gate coupled to node 320, and a source coupled to Q output 224.

Scan flip-flop 300 includes transistors 326 and 328. Transistor 326 may be a p-type transistor, and transistor 328 may be an n-type transistor. Transistor 326 includes a source coupled to first voltage rail 102, a gate coupled to node 320, and a drain coupled to node 330. Transistor 328 includes a drain coupled to second voltage rail 104, a gate coupled to node 320, and a source coupled to node 330.

Scan flip-flop 300 also includes transistors 332, 334, 336, and 338. Transistors 332 and 334 may be p-type transistors, and transistors 336 and 338 may be n-type transistors. Transistor 332 has a drain coupled to first voltage rail 102 and a source coupled to a drain of transistor 334. A gate of transistor 332 is coupled to node 330. Transistor 334 has a source coupled to a source of transistor 336 and a gate coupled to CLKZ input 112. Transistor 336 has a drain coupled to a source of transistor 338 and a gate coupled to CLK input 110. Transistor 338 has a drain coupled to second voltage rail 104 and a gate coupled to node 330.

Scan flip-flop 300 is a scan flip-flop that includes input mux 100 as described above. Scan flip-flop 300 includes circuitry outside of input mux 100 that is useful for managing the operation of the scan flip-flop. Scan flip-flop 300 receives inputs such as a D input, SD input, SCAN input, SCANZ input, CLK input, etc., at input mux 100 as described above. Scan flip-flop 300 produces an output Q at Q output 224 at the appropriate clock edge based on the above-listed inputs. Scan flip-flop 300 therefore is an example circuit that shows how input mux 100 may be implemented within a scan flip-flop.

In examples herein, the effective voltages of some transistors in the input multiplexer of the scan flip-flop are reduced, which slows down the transistors in the input multiplexer (particularly, the transistors in column 120). This results in an improvement in the hold time requirement for the flip-flop during scan mode. Significant improvements may be achieved for lower voltage devices. The reduction in hold time requirement results in lesser numbers of hold buffers for flip-flop circuits, which reduces area usage and routing congestion. Also, the examples described herein do not impact other timing parameters, such as setup time or clock-to-Q delay. In other examples, the systems described herein may be useful in other flip-flop variants, such as those having an asynchronous CLEAR or PRESET input. Asynchronous inputs of a flip-flop control the output regardless of the clock input status.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A system, comprising:
   a scan flip-flop that includes a data input, a clock input, a scan data input, a scan enable input, and an output, wherein the scan flip-flop also includes:
   a first transistor and a second transistor coupled to the data input;
   a third transistor coupled to the clock input and a fourth transistor coupled to an inverse clock input;
   a fifth transistor coupled to the scan enable input and the first transistor;
   a sixth transistor coupled to an inverse scan enable input and the second transistor; and
   an input multiplexer that includes the first transistor, second transistor, fifth transistor, and sixth transistor, and also includes a seventh transistor coupled to the scan data input, an eighth transistor coupled to the scan data input, a ninth transistor coupled to the scan enable input, and a tenth transistor coupled to the inverse scan enable input, wherein the input multiplexer also includes:
   a first diode-connected transistor coupled between a first voltage rail and the seventh transistor; and
   a second diode-connected transistor coupled between a second voltage rail and the eighth transistor.

2. The system of claim 1, wherein the seventh transistor is coupled to the tenth transistor, and the eighth transistor is coupled to the ninth transistor.

3. The system of claim 1, wherein the first transistor and the second transistor are coupled to the eighth transistor and the ninth transistor.

4. The system of claim 1, wherein the first diode-connected transistor is a p-type device having a gate terminal coupled to a drain terminal.

5. The system of claim 1, wherein the second diode-connected transistor is an n-type device having a gate terminal coupled to a drain terminal.

6. The system of claim 1, wherein the seventh transistor and the tenth transistor are p-type devices, and the eighth transistor and the ninth transistor are n-type devices.

7. The system of claim 1, wherein the first voltage rail is coupled to a voltage source and the second voltage rail is coupled to ground.

8. The system of claim 1, wherein the first transistor is a p-type device and the second transistor is an n-type device.

9. The system of claim 1, wherein the third transistor is a p-type device and the fourth transistor is an n-type device.

10. The system of claim 1, wherein the fifth transistor is coupled to the first voltage rail, and the sixth transistor is coupled to the second voltage rail.

11. A system, comprising:
    a scan flip-flop that includes a functional data input, a clock input, a scan data input, a scan enable input, and an output, wherein the scan flip-flop also includes:
    a first transistor and a second transistor coupled to the functional data input, wherein the functional data input is configured to receive a data signal;
    a third transistor coupled to the clock input and a fourth transistor coupled to an inverse clock input, wherein the clock input is configured to receive a clock signal, and the inverse clock input is configured to receive an inverse of the clock signal;
    a fifth transistor coupled to the scan enable input and the first transistor;
    a sixth transistor coupled to an inverse scan enable input and the second transistor; and
    an input multiplexer that includes the first transistor, second transistor, fifth transistor, and sixth transistor, and also includes a seventh transistor coupled to the scan data input, an eighth transistor coupled to the scan data input, a ninth transistor coupled to the scan enable input, and a tenth transistor coupled to the inverse scan enable input, wherein the input multiplexer is configured to select between the functional data input and the scan data input, and wherein the input multiplexer also includes:
    a first diode-connected transistor coupled between a first voltage rail and the seventh transistor, wherein the first diode-connected transistor is configured to provide a first voltage to a source terminal of the seventh transistor, wherein the first voltage is less than a first supply voltage; and
    a second diode-connected transistor coupled between a second voltage rail and the eighth transistor, wherein the second diode-connected transistor is configured to provide a second voltage to a source terminal of the eighth transistor, wherein the second voltage is greater than a second supply voltage.

12. The system of claim 11, wherein the second supply voltage is ground.

13. The system of claim 11, wherein providing the first voltage to the source terminal of the seventh transistor and the second voltage to the source terminal of the eighth transistor reduces a hold time requirement of the scan data input with respect to the clock input.

14. The system of claim 11, wherein the input multiplexer is configured to select between the functional data input and the scan data input based on a signal at the scan enable input.

15. The system of claim 11, wherein the seventh transistor is coupled to the tenth transistor, and the eighth transistor is coupled to the ninth transistor.

16. The system of claim 11, wherein the first diode-connected transistor is a p-type device having a gate terminal coupled to a drain terminal.

17. The system of claim 11, wherein the second diode-connected transistor is an n-type device having a gate terminal coupled to a drain terminal.

18. The system of claim 11, wherein the scan flip-flop is a negative edge triggered flip-flop.

19. The system of claim 11, wherein the scan flip-flop includes an asynchronous input.

20. The system of claim 11, wherein providing the first voltage to the source terminal of the seventh transistor and the second voltage to the source terminal of the eighth transistor does not affect a hold time or setup requirement of the functional data input with respect to the clock input.

\* \* \* \* \*